(12) United States Patent
Ersoy et al.

(10) Patent No.: US 9,548,655 B2
(45) Date of Patent: Jan. 17, 2017

(54) DIFFERENTIAL DYNAMIC CHARGE PUMP CIRCUIT

(71) Applicant: NXP B.V., Eindhoven (NL)

(72) Inventors: Selcuk Ersoy, Eindhoven (NL); Robert Hendrikus Margaretha van Veldhoven, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/874,315

(22) Filed: Oct. 2, 2015

(65) Prior Publication Data

US 2016/0099638 A1 Apr. 7, 2016

(30) Foreign Application Priority Data

Oct. 6, 2014 (EP) .................................. 14187782

(51) Int. Cl.
*H03L 7/06* (2006.01)
*H02M 3/07* (2006.01)
(Continued)

(52) U.S. Cl.
CPC ............... *H02M 3/07* (2013.01); *H02M 3/073* (2013.01); *H03L 7/0896* (2013.01); *H04R 3/00* (2013.01); *H04R 19/04* (2013.01)

(58) Field of Classification Search
CPC .... H03L 7/0814; H03L 7/0891; H03L 7/0898; H03L 7/07; H03L 2207/14; H03L 7/0896; H03L 7/107; H03L 7/1072; H03L 2207/06; H03L 7/099; H03L 7/0995; H03L 7/0802; H03L 7/089; H03L 7/187; H03L 7/199; H03L 7/093; H04R 19/04; H04R 3/00; H03F 3/45874; H03F 3/45887; H03F 1/0205; H03F 1/0266; H03F 1/0277; H03F 1/223; H03F 1/56; H03F 21/00; H03F 2200/111; H03F 2200/162; H03F 2200/336; H03F 2200/351
(Continued)

(56) References Cited

U.S. PATENT DOCUMENTS 4,016,476 A    4/1977    Morokawa et al.
5,289,137 A *   2/1994    Nodar ..................... G05F 3/205
                                                                                                 330/296
(Continued)

OTHER PUBLICATIONS

Extended Search Report for Patent Appln. No. 14187782.9 (Jun. 18, 2015).

*Primary Examiner* — Lun-See Lao (57) ABSTRACT

A differential dynamic charge pump circuit comprising; a first charging stage in series with a second charging stage; the first charging stage comprising a first circuit input for receiving an alternating clock signal; a second circuit input for receiving an inverted version of the alternating clock signal; a first output inverter arrangement configured to receive output voltages from upper and lower charge pump arrangements and having a first output and a second output for providing a dynamic differential output; the second charging stage comprising a first input and a second input configured to receive the output signal from the first stage; a second output inverter arrangement configured to receive output voltages from upper and lower charge pump arrangements and having a first output and a second output for providing a dynamic differential output of the circuit.

15 Claims, 3 Drawing Sheets

(51) Int. Cl.
*H04R 3/00* (2006.01)
*H04R 19/04* (2006.01)
*H03L 7/089* (2006.01)

(58) Field of Classification Search
USPC ........ 381/113, 120, 370, 384; 327/157, 536, 327/148, 537, 306; 330/269, 297, 296
See application file for complete search history.

(56) References Cited

U.S. PATENT DOCUMENTS

| | | | |
|---|---|---|---|
| 6,222,402 B1 * | 4/2001 | Boerstler | H03L 7/0896 327/157 |
| 7,808,324 B1 * | 10/2010 | Woodford | H03F 3/185 330/296 |
| 8,098,839 B2 * | 1/2012 | Chen | G05F 1/46 381/370 |
| 2003/0034813 A1 * | 2/2003 | Sanduleanu | H03F 3/3432 327/157 |
| 2014/0176356 A1 | 6/2014 | Li | |

* cited by examiner

DIFFERENTIAL DYNAMIC CHARGE PUMP CIRCUIT

CROSS-REFERENCE TO RELATED APPLICATIONS

This application claims the priority under 35 U.S.C. §119 of European patent application no. 14187782.9, filed on Oct. 6, 2014, the contents of which are incorporated by reference herein.

SUMMARY

This invention relates to a differential charge pump circuit. In particular, it relates to a to cascaded two-stage differential charge pump circuit. The circuit has particular application as a driver circuit such as a sensor driver circuit. The invention also relates to a sensor arrangement and, in particular, a MEMS microphone having a bias voltage applied thereto by said differential charge pump circuit.

According to the invention we provide a differential dynamic charge pump circuit. The gate voltages applied to the output invertors of each stage of the charge pump circuit is advantageous as high and low voltages can be created without exceeding operation voltage limits between the transistor terminals of the output invertors.

According to a further aspect of the invention we provide a sensor arrangement

BRIEF DESCRIPTION OF THE DRAWINGS

There now follows, by way of example only, a detailed description of embodiments of the invention with reference to the following figures, in which.

DETAILED DESCRIPTION OF DRAWINGS

Figure 1:
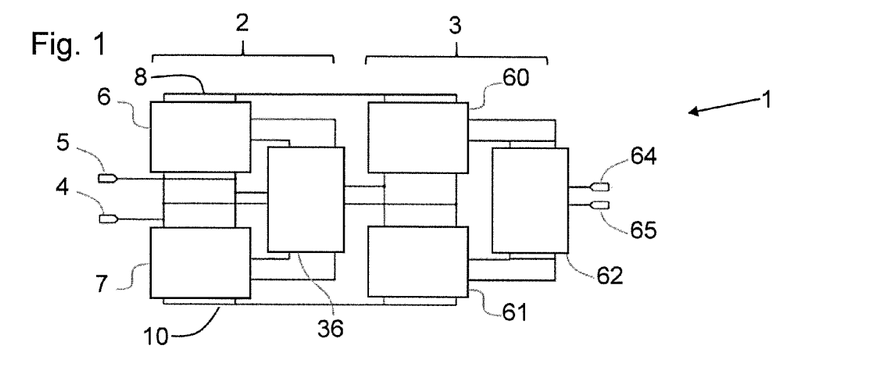
FIG. 1 shows a circuit diagram of an example differential dynamic charge pump circuit.
Figure 2:
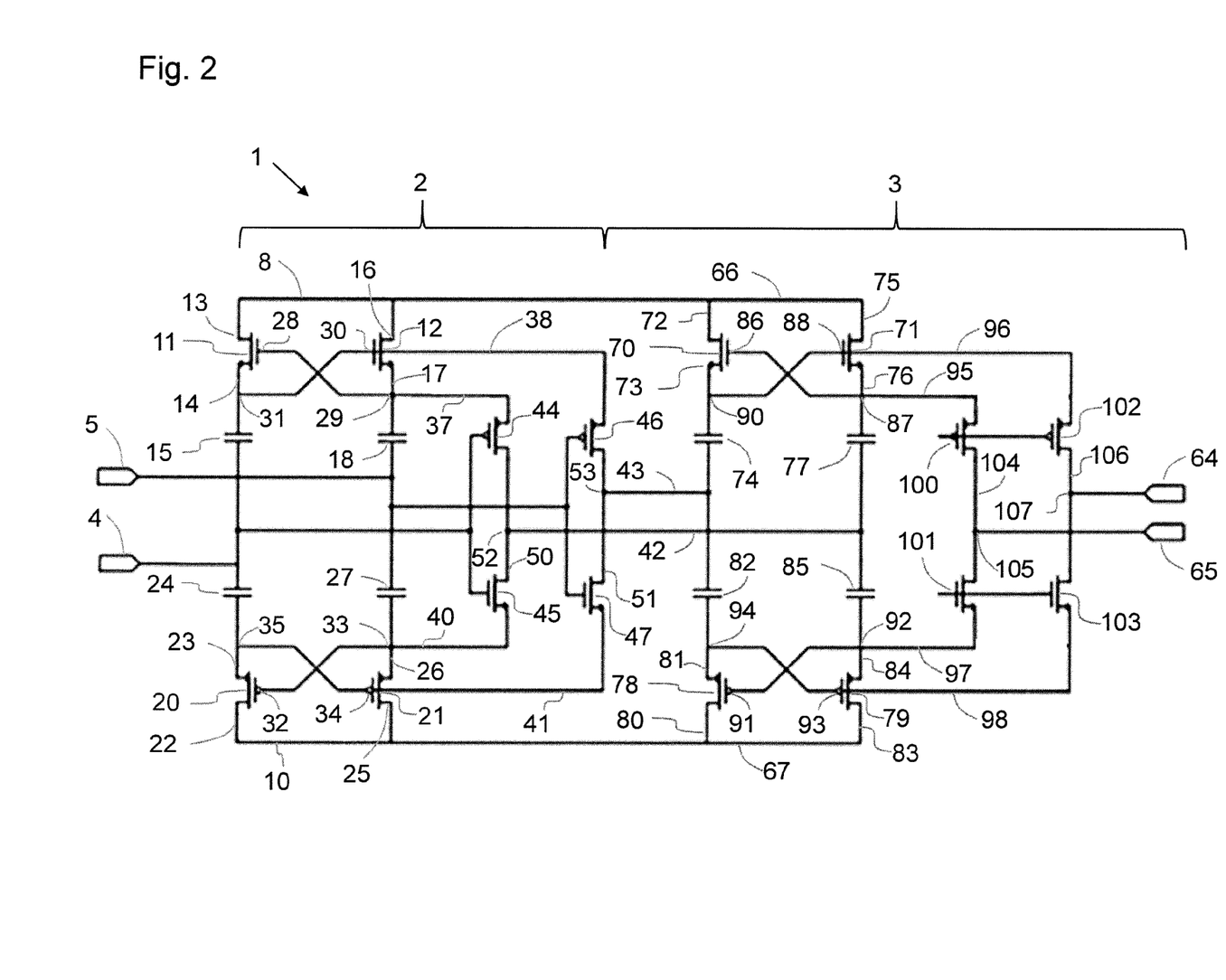
FIG. 2 shows a more detailed circuit diagram of the differential dynamic charge pump circuit of FIG. 1.

FIGS. 1 and 2 show a differential dynamic charge pump circuit 1 comprising a first charging stage 2 in series with a second charging stage 3. The circuit 1 is configured to provide a differential output and uses a dynamic input clock signal to create voltages greater than a circuit supply voltage and less than a ground level. The differential output provides an advantageous potential difference for driving a sensor element, such as a MEMS microphone.

The first charging stage 2 comprises a first circuit input 4 for receiving an alternating clock signal and a second circuit input 5 for receiving a 180 degree out of phase version of the alternating clock signal. The alternating clock signal may comprise substantially a square wave oscillating between +Vdd Volts (the circuit supply voltage) and 0 Volts. The out of phase version may therefore also comprise a square wave oscillating between +Vdd Volts and 0 Volts wherein the out of phase version is low when the clock signal is high and vice versa.

The first charging stage 2 comprises an upper charge pump 6 for generating a positive voltage (above the supply voltage) and a lower charge pump 7 for generating a negative voltage (below the ground level voltage). The upper charge pump 6 is arranged between a voltage supply terminal 8 for receiving a positive supply voltage for the circuit 1 and the first and second input 4, 5. The lower charge pump 7 is arranged between a ground terminal 10 of the circuit 1 and the first and second input 4, 5.

With particular reference to FIG. 2, the upper charge pump arrangement 6 of the first charging stage 2 comprises a first switch 11 and a second switch 12, which in this embodiment comprise transistors. The first transistor 11 has a first (drain) terminal 13 connected to the voltage supply terminal 8 and a second (source) terminal 14 connected to a first plate of a first capacitor 15. A second plate of the first capacitor 15 is connected to the first input 4.

The second switch 12 has a first (drain) terminal 16 connected to the voltage supply terminal 8 and a second (source) terminal 17 connected to a first plate of a second capacitor 18. A second plate of the second capacitor 18 is connected to the second input 5.

The lower charge pump arrangement 7 of the first charging stage 2 also comprises a first to switch 20 and a second switch 21, which in this embodiment comprise transistors. The first transistor 20 has a first (drain) terminal 22 connected to the ground terminal 10 and a second (source) terminal 23 connected to a first plate of a first capacitor 24. A second plate of the first capacitor 24 is connected to the first input 4.

The second switch 21 has a first (drain) terminal 25 connected to the ground terminal 10 and a second (source) terminal 26 connected to a first plate of a second capacitor 27. A second plate of the second capacitor 27 is connected to the second input 5.

Considering the upper charge pump 6, the first transistor 11 includes a gate terminal 28 to receive a control signal for the transistor 11. The gate terminal 28 includes a connection to a node 29 between the source terminal 17 of the second transistor 12 and the first plate of the second capacitor 18. Thus, the control of the first transistor 11 is provided by the voltage at node 29, which is related to the out of phase clock signal received at the second input 5 by virtue of said second input 5 being connected to the second capacitor 18.

Considering the upper charge pump 6, the second transistor 12 includes a gate terminal 30 to receive a control signal for the second transistor 12. The gate terminal 30 includes a connection to a node 31 between the source terminal 14 of the first transistor 11 and the first plate of the first capacitor 15. Thus, the control of the second transistor 12 is provided by the voltage at node 31, which is related to the clock signal received at the first input 4 by virtue of said first input 4 being connected to the first capacitor 15.

Considering the lower charge pump 7, the first transistor 20 includes a gate terminal 32 to receive a control signal for the first transistor 20. The gate terminal 32 includes a connection to a node 33 between the source terminal 26 of the second transistor 21 and the first plate of the second capacitor 27. Thus, the control of the first transistor 20 is provided by the voltage at node 33, which is related to the out of phase clock signal received at the second input 5 by virtue of said second input 5 being connected to the second capacitor 27.

Considering the lower charge pump 7, the second transistor 21 includes a gate terminal 34 to receive a control signal for the second transistor 21. The gate terminal 34 includes a connection to a node 35 between the source terminal 23 of the first transistor 20 and the first plate of the first capacitor 24. Thus, the control of the second transistor 21 is provided by the voltage at node 35, which is related to the clock signal received at the first input 4 by virtue of said input 4 being connected to the first capacitor 24.

The control signal applied to the gate terminal 28, gate terminal 30, gate terminal 32 and/or gate terminal 34 may alternatively be generated by a controller (not shown). The controller may be synchronised with the input clock signal and generate the appropriate control signal(s) to achieve charge pumping by charging the associated capacitor and connecting to an output over the clock period. As a further alternative, the control signal(s) may be derived directly from the clock signal/inverted clock signal rather than at the nodes 29, 31, 33, 35.

The upper and lower charge pumps 6, 7 of the first stage 2 provide their output to a first output invertor arrangement 36.

The upper charge pump 6 provides two outputs to the first output invertor arrangement. A first output 37 is provided by the first node 29. A second output 38 is provided by the second node 31. Likewise, the lower charge pump 7 provides two outputs to the first output invertor arrangement. A first output 40 is provided by the first node 33 and a second output 41 is provided by the second node 35.

The output invertor arrangement 36 (shown in FIG. 1) includes a plurality of switches configured to selectively provide the signals received from the first and second outputs 37, 38, 40, 41 of the charge pump (upper and lower) 6, 7 to two invertor outputs 42, 43. The two invertor outputs 42, 43 provide a dynamic differential output.

The first output inverter arrangement 36 (shown in FIG. 1) includes a first pair of transistors 44, 45 to control the voltage applied to the first output 42 and a second pair of transistors 46, 47 configured to control the voltage applied to the second output 43. The transistors 44, 45, 46, 47 act as switches that are controlled by the signal from the first and second circuit inputs 4, 5. Each of the transistors includes a source terminal, drain terminal and gate terminal for controlling the conductivity of the source-drain path. The gate terminals of the first pair of transistors 44, 45 receive a control signal from the first circuit input 4. The gate terminals of the second pair of transistors 46, 47 receive a control signal from the second circuit input 5. Accordingly, one of the pairs of transistors is dynamically controlled by the input clock signal and the other pair by its inverted version.

to The source terminal of the first transistor 44 of the first pair of transistors receives the signal from the output 37 that comprises the voltage at node 29 of the upper charge pump 6. The source terminal of the first transistor 46 of the second pair of transistors receives the signal from output 38 that comprises the voltage at node 31 of the upper charge pump 6. The source terminal of the second transistor 45 of the first pair of transistors receives the signal from output 40 that comprises the voltage at the node 33 of the lower charge pump 7. The source terminal of the second transistor 47 of the second pair of transistors receives the signal from output 41 that comprises the voltage at node 35 of the lower charge pump 7.

The drain terminals of the first pair of transistors 44, 45 are connected together by a first drain connection 50, the first output 42 of the first output invertor arrangement formed by a node 52 on said first drain connection 50. The drain terminals of the second pair of transistors 46, 47 are connected together by a second drain connection 51, the second output 43 of the first output invertor arrangement formed by a node 53 on said second drain connection.

Thus, the first output invertor arrangement 36 is configured such that on a high clock signal at the first circuit input 4 (and therefore a low clock signal at the second circuit input 5), the first pair of transistors 44 and 45 receive a high control signal and the voltage at node 33 is applied to the output 42. During the same time, the first transistor 46 of the second pair of transistors 46, 47 is conductive due to the low clock signal supplied from the second circuit input 5 and therefore the voltage at output 43 is equal to the voltage at node 31.

On the other half of the clock period, the second circuit input 5 is high and the first circuit input 4 is low. Accordingly, the first transistor 44 of the first pair of transistors 44, 45 is conductive and the voltage at node 29 is applied to the first output 42. During the same time, the second transistor 47 of the second pair of transistors 46, 47 is conductive and the voltage at node 35 is applied to the second output 43.

The first output 42 of the first stage forms the first input to the second stage 3. Likewise, the second output 43 of the first stage 2 forms the second input to the second stage 3.

The second stage 3 also comprises a charge pump section of upper 60 and lower 61 parts and a second output invertor arrangement 62 (as shown in FIG. 1). The charge pump section is configured to use the output of the first stage and pump the voltage to higher in the upper part 60 and lower in the lower section 61. The voltages output 95, 96, 97, 98 by the charge pump section of the second stage are, like the equivalent outputs of the first stage, dynamic. Thus, the second output invertor arrangement 62 is configured to dynamically select and connect each of the charge pump outputs to the first and second circuit outputs 64, 65.

The upper and lower charge pump section of the second stage 3 is substantially similar to the equivalent structure in the first stage 2. Thus, the charge pump section comprises the upper charge pump arrangement 60 between a voltage supply terminal 66 for receiving the supply voltage of the circuit and the first and second input 42, 43. The voltage supply terminal 66 is shown continuous with the voltage supply terminal 8 of the first stage 2 and comprises a supply voltage rail. It will be appreciated that distinct connections to a circuit supply voltage may be provided.

The lower charge pump arrangement 61 is arranged between a ground terminal 67 of the circuit and the first and second input 42, 43.

Each of the upper and lower charge pump arrangements (of both stages) include two capacitors and two switches and provide for the charging and discharging of the capacitors in combination with the voltage supply/ground voltage to provide a pumped voltage.

The upper charge pump arrangement 60 of the second charging stage 3 comprises a first switch formed by a transistor 70 and a second switch formed by a second transistor 71. The first transistor 70 has a first (drain) terminal 72 connected to the voltage supply terminal 66 and a second (source) terminal 73 connected to a first plate of a first capacitor 74. A second plate of the first capacitor 74 is connected to the second input 43 (second output of the first stage 2).

The second transistor 71 has a first (drain) terminal 75 connected to the voltage supply terminal 66 and a second (source) terminal 76 connected to a first plate of a second capacitor 77. A second plate of the second capacitor 77 is connected to the first input 42 (the first output of the first stage 2).

The lower charge pump arrangement 61 of the second charging stage 3 also comprises a first switch formed by a first transistor 78 and a second switch formed by a second transistor 79. The first transistor 78 has a first (drain) terminal 80 connected to the ground terminal 67 and a second (source) terminal 81 connected to a first plate of a first capacitor 82. A second plate of the first capacitor 82 is connected to the second input 43.

The second switch 79 has a first (drain) terminal 83 connected to the ground terminal 67 and a second (source) terminal 84 connected to a first plate of a second capacitor 85. A second plate of the second capacitor 85 is connected to the first input 42.

Considering the upper charge pump 60, the first transistor 70 includes a gate terminal 86 to receive a control signal for the first transistor 70. The gate terminal 86 includes a connection to a node 87 between the source terminal 76 of the second transistor 71 and the first plate of the second capacitor 77. Thus, the control of the first transistor 70 is provided by the voltage at node 87, which is related to the first output of the first stage by virtue of said output 42 being connected to the second capacitor 77.

Considering the upper charge pump 60, the second transistor 71 includes a gate terminal 88 to receive a control signal for the second transistor 71. The gate terminal 88 includes a connection to a node 90 between the source terminal 73 of the first transistor 70 and the first plate of the first capacitor 74. Thus, the control of the second transistor 71 is provided by the voltage at node 90, which is related to the second output 43 by virtue of said output 43 being connected to the first capacitor 74.

Considering the lower charge pump 61, the first transistor 78 includes a gate terminal 91 to receive a control signal for the first transistor 78. The gate terminal 91 includes a connection to a node 92 between the source terminal 84 of the second transistor 79 and the first plate of the second capacitor 85. Thus, the control of the first transistor 78 is provided by the voltage at node 92, which is related to the first output 42 of the first stage 2 by virtue of said output 42 being connected to the second capacitor 85.

Considering the lower charge pump 61, the second transistor 79 includes a gate terminal 93 to receive a control signal for the second transistor 79. The gate terminal 93 includes a connection to a node 94 between the source terminal 81 of the first transistor 78 and the first plate of the first capacitor 82. Thus, the control of the second transistor 79 is provided by the voltage at node 94, which is related to second output 43 of the first stage 2 by virtue of said second output 42 being connected to the first capacitor 82.

As with the first stage described above, the control signal applied to the gate terminal 86, gate terminal 88, gate terminal 91 and/or gate terminal 93 may alternatively be generated by a controller (not shown). As a further alternative, the control signal(s) may be derived directly from the clock signal/inverted clock signal.

The upper and lower charge pumps 60, 61 of the second stage 3 provide their output to the output invertor arrangement 62 of the second stage.

The upper charge pump 60 provides two outputs to the second output invertor arrangement 62. A first output 95 is provided by the first node 87. A second output 96 is provided by the second node 90. Likewise, the lower charge pump 61 provides two outputs to the second output invertor arrangement 62. A first output 97 is provided by the first node 92 and a second output 98 is provided by the second node 94.

The second output inverter arrangement 62 includes a first pair of transistors 100, 101 to control the voltage applied to the second circuit output 65 and a second pair of transistors 102, 103 configured to control the voltage applied to the first output 64.

The second output invertor arrangement 62 of the second stage differs from that of the first stage with respect to how the transistors 100-103 are controlled. In particular, the transistors 100-103 are configured to be supplied with a constant gate terminal voltage rather than an alternating voltage. This has been found to provide for an advantageous circuit layout in that source-drain, gate-drain and source-gate voltage do not exceed threshold/safety limits. The connection between the charge pump and the output invertor arrangement 62 in the second stage 3 is also different to the equivalent connection in the first stage 2.

Each of the transistors 100-103 includes a source terminal, drain terminal and gate terminal. As the voltage at the gate terminal of each transistor 100-103 is constant, the source-gate voltage provides for control of the voltage applied to the circuit outputs 64, 65.

The source terminal of the first transistor 100 of the first pair of transistors is connected to the first output 95 and the source terminal of the first transistor 102 of the second pair of transistors is connected to the second output 96 from the upper charge pump 60 of the second stage 3.

The source terminal of the second transistor 101 of the first pair is connected to the first to output 97 and the source terminal of the second transistor 103 of the second pair of transistors is connected to the second output 98 of the lower charge pump 61.

The drain terminals of the first pair of transistors 100, 101 are connected together by a third drain connection 104, and the second circuit output 65 is formed by a node 105 on said third drain connection 104. The drain terminals of the second pair of transistors 102, 103 are connected together by a fourth drain connection 106, and the first circuit output 64 is formed by a node 107 on said fourth drain connection 106.

The gate terminal of the first transistor 100 of the first pair and the gate terminal of the first transistor 102 of the second pair (i.e. those transistors that directly connect to the upper charge pump 60) are configured to receive the circuit supply voltage, Vdd. The gate terminal of the second transistor 101 of the first pair and the second transistor 103 of the second pair (i.e. those transistors that directly connect to the lower pump 61) are configured to receive the circuit ground voltage, 0 V.

It will be appreciated that in other embodiments, other gate voltages may be used. In general, the first transistors of the pairs, that connect to the upper, positive voltage, charge pump, are provided with a positive gate voltage above a threshold. The threshold may be selected to ensure the potential between the transistor terminals connected to the outputs 95, 96 and the gate terminals does not exceed a safety or operational limit of the transistor 100, 102 (when the output of the second charge pump is at its highest voltage level). Further, the second transistors 101, 103 of the pairs, that connect to the lower, negative voltage, charge pump, are provided with a gate voltage below a further threshold. The further threshold may be selected to ensure the potential between the transistor terminals connected to the outputs 97, 98 and the gate terminals (when the output of the second, lower charge pump is at its lowest negative voltage level) does not exceed a safety or operational limit of the transistor 101, 103.

In use, the first and second transistors 11, 12 of the first, upper charge pump 6 are configured to be controlled such that a voltage above the supply voltage 8 is generated and applied to the associated output inverter arrangement 36 by virtue of a connection between the voltage of at least one of the capacitors 15, 18 and the voltage supplied at the supply voltage terminal 8. Likewise, the first and second transistors 20, 21 of the first, lower charge pump 7 are configured to be controlled such that a voltage below the ground voltage is generated and applied to the associated output inverter arrangement 36 by virtue of a connection to the voltage of at least one of the capacitors 24, 27.

The out of phase clock signals from the circuit inputs 4, 5 provide for the charging and discharging of the capacitors 15, 18, 24, 27 as each clock signal goes high and low. The clock signals may be configured to oscillate between the circuit supply voltage and 0 Volts or ground. For the upper charge pump 6, the voltage at node 29 rises when the clock signal on the second input 5 goes high. This voltage is applied to the gate terminal 28 of the first transistor 11 and thus forces the first transistor 11 to conduct. The drain terminal 14 of the first transistor 11 drops to the supply voltage (Vdd) which forces the second transistor 12 to turn off because its gate-source voltage, $V_{GS}$, will be negative. Therefore, the voltage at the source terminal 17 of the second transistor 12 is boosted to 2*vdd level. On the other phase, where the first input 4 is high and second input 5 is low, the same procedure repeats for the other node 31. Consequently, the voltage at node 29 swings between the supply voltage Vdd and substantially 2*Vdd.

More specifically, following an initial charging cycle, the capacitors 15 and 18 will be initially charged, over the initial cycles, to have 1 Vdd voltage across them when input signals from input 4 and input 5 are at zero. After the initial cycle(s), when the input 4 increases to vdd from zero voltage, the second plate of the first capacitor 15 becomes vdd and its first plate becomes 2 vdd. When the first capacitor's first plate voltage increases to 2 Vdd it forces the second transistor 12 to conduct as its gate voltage becomes 2 Vdd while its source voltage is at Vdd. This ensures that the node 29 stays at Vdd level during this phase of the clock. Further, the first transistor 11 is off as its source terminal is at a voltage of 2 Vdd while its gate and drain are at voltage of vdd. Therefore, the charge across capacitor 15 cannot escape and the voltage at node 14 stays at 2 Vdd.

In the next clock phase, when the second input 5 is high, at Vdd, and the first input 4 is low, the same operation repeats for the second capacitor 18. The second plate voltage of the second capacitor 18 increases from zero to Vdd while the second plate voltage of the first capacitor 15 drops to zero. The voltage at node 29 increases to 2 Vdd and the voltage at node 14 drops to Vdd. In this case, the first transistor 11 conducts and ensures that node 14 stays at Vdd level. This makes the second transistor 12 to off and therefore the charge across the second capacitor 18 cannot escape and the voltage at node 29 stays at 2 Vdd in this clock phase. This operation continues in cycles and creates an alternating signals for providing to the first inverter.

Similar behaviour is also observed on the lower charge pump 7. When the clock signal on the first circuit input 4 goes low, the voltage at node 35 drops to −Vdd and forces the second transistor 21 to turn on. This makes the gate-source voltage, $V_{GS}$, of the first transistor 20 positive and turns the first transistor off (i.e. non-conductive). On the other clock phase when first circuit input is high and the second circuit input is low, the same procedure repeats for the node 33 such that the voltage at node 33 swings between ground and −Vdd.

More specifically, after the initial cycle(s), the first capacitor 24 is charged to Vdd. When the clock signal at the first input 4 drops from Vdd to zero, this will cause node 35 to drop to −Vdd. The voltage of −Vdd at terminal 23 causes the second transistor 21 to conduct and keep the node 33 at zero volts. The first transistor 20 stays non-conductive (off) during this phase as its source voltage is at −Vdd while its gate and drain are at zero. Therefore, the charge across the first capacitor 24 does not leak and the node 35 stays at −Vdd voltage. In the next clock phase the same applies to the second capacitor 27 and the second transistor 34. Thus alternating signals between 0 volts and −Vdd volts is created at the nodes 35 and 33.

Thus, the first charge pump dynamically creates a voltage (periodically) of +2*Vdd at the upper charge pump and of −Vdd at the lower charge pump. The first output inverter 36 is configured to connect the voltage at the nodes 29, 31, 33, 35 to the first and second outputs 42, 43 of the first stage at the appropriate time such that this full voltage swing is provided at the first and second outputs. In particular, the first output 42 is configured to provide an alternating signal between substantially 2 times the supply voltage Vdd, and −Vdd and the second output 43 provides a signal having the same voltage swing but is out of phase with the signal applied to the first output 42.

An appropriate switching sequence can be obtained by applying the first clock signal of the first circuit input 4 to the gate terminals of the first pair of transistors 44, 45 and the second clock signal of the second circuit input 5 to the gate terminals of the second pair of transistors 46, 47.

In particular, when node 29 is at 2 Vdd, the signal at the second input 5 is high, at Vdd, and the first input 4 is at zero. The node 33 is also zero in the same clock phase. Therefore, transistor 44 has 2 Vdd at its source and zero at its gate terminal (the signal at the first input 4 is zero during this phase). The transistor 44 therefore conducts and sets the output 42 to 2 Vdd. The gate and source of the second transistor 45 of the first pair are both at zero potential so it is non-conductive (off).

In the next clock phase, the first transistor 44 of the first pair has its source voltage drop to Vdd and the signal at the first input 4 rises to Vdd. Therefore, the first transistor 44 of the first pair turn off. In this phase, the source of the second transistor 45 drops to −Vdd and its gate is at Vdd level; therefore transistor 45 conducts and set the output 42 to −Vdd. This operation continues in cycles such that the output 42 continuously switches between 2 Vdd and −Vdd. The second pair of transistors 46, 47 operate in a similar manner, but the gate terminals are controlled by the signal at the second input 5. Thus, the second output 43 also continuously switches between 2 Vdd and −Vdd but is 180° out of phase with the first output 42.

The input to the second stage 3 thus comprises two out of phase signals that vary between 2 Vdd and −Vdd. The second stage upper charge pump boosts the voltage to 4 Vdd in the same manner as the upper charge pump of the first stage 2, thereby providing at first and second outputs 95, 95 a voltage that varies between +4 Vdd and +Vdd. The second stage lower charge pump also boosts the voltage to −3 Vdd in a similar manner to the first stage lower charge pump, thereby providing at first and second outputs 97, 98 a voltage that varies between −3 Vdd and 0 volts.

Turning now to the output invertor arrangement of the second stage 3, the gates of output transistors 101-104 are set to constant voltages. The first transistors 100, 102 of the first and second pairs are of PMOS type and have gate terminals that receive the supply voltage Vdd. The second transistors 101, 103 of the first and second pairs are of NMOS type and have gate terminals that are set to ground.

The source terminals of the "first" transistors 100 and 102 of the transistor pairs alternate between Vdd and 4 Vdd. As their gate terminal is set to Vdd, they conduct only when their source terminal is at 4 Vdd level due to the resulting gate-source voltage. The first transistors 100, 102 are off when their source terminals are at Vdd.

The source terminals of the second transistors 101 and 103 are supplied by first and second outputs 97, 98 and thus alternate in between zero and −3 Vdd. When their gate is fixed to zero voltage, they conduct only when their source voltage become −3 Vdd and are off otherwise, due to the resulting gate-source voltage.

Thus, as the 4 Vdd and −3 Vdd voltage on outputs 95, 96, 97, 98 are created in different to phases of the clock signal, the PMOS, first transistors 100, 102 and NMOS, second transistors 101, 103 do not conduct at the same clock phase and consequently the first and second output 64, 65 alternates between 4 Vdd and −3 Vdd.

Figure 3:
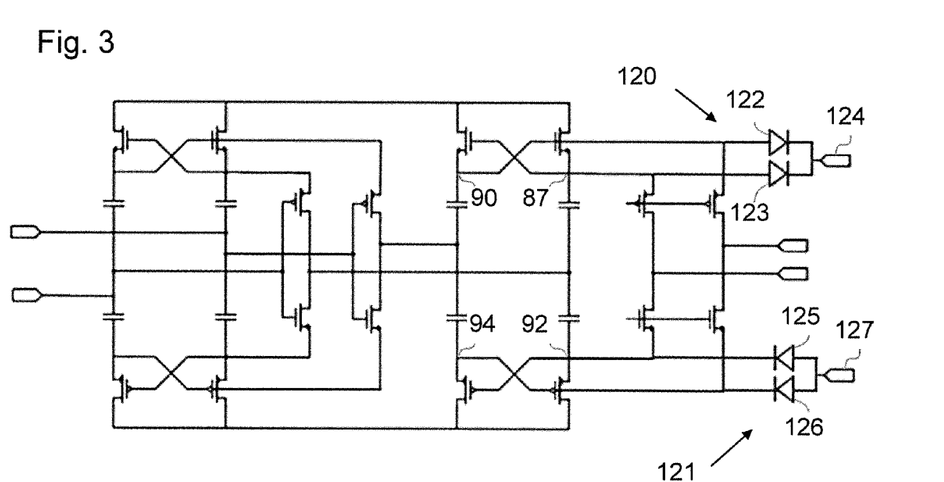
FIG. 3 shows a circuit diagram of a second example differential dynamic charge pump circuit based on FIG. 2.

FIG. 3 shows a modification to the circuit shown in FIGS. 1 and 2. The modification relates to the addition of a first rectifier 120 and a second rectifier 121. The first rectifier 120 is configured to rectify the output of the upper charge pump 60 of the second stage. The second rectifier 121 is configured to rectify the output of the lower charge pump 61 of the second stage. Thus, the first rectifier 120 comprises a first diode 122 having its anode connected to node 90 and a second diode 123 having its anode connected to node 87. The cathodes of both diodes 122, 123 are connected to a first DC output 124. Thus, the first DC output 124 provides a constant voltage of 4*Vdd.

The second rectifier 121 comprises a first diode 125 having its cathode connected to node 92 and a second diode 126 having its cathode connected to node 94. The anodes of both diodes 125, 126 are connected to a second DC output 127. Thus, the second DC output 127 provides a constant voltage of −2*Vdd.

The first and second DC outputs 124, 127 may include a smoothing capacitor arrangement to reduce output ripple.

It will be appreciated that the circuit may be implemented in a bulk CMOS process. The transistors of the lower charge pumps or connected thereto may be NMOS and the transistors of the upper charge pumps or connected thereto may be PMOS. Further, the nodes or components in the circuit that experience negative voltages may be isolated from the other nodes/components. It will be appreciated that some or all of the transistors may be isolated in separate wells to avoid reverse biasing of drain and source diffusions.

Figure 4:
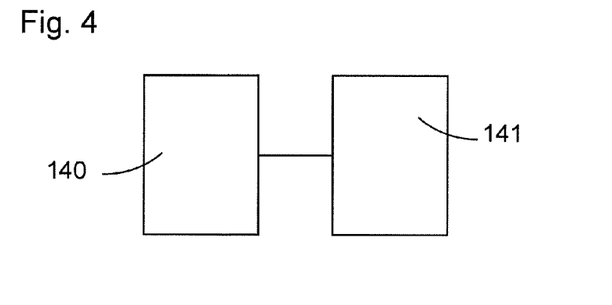
FIG. 4 shows an example application of the dynamic charge pump circuit.

FIG. 4 shows a sensor 140, such as a MEMS microphone sensor. The sensor 140 is biased by a bias voltage applied from the differential dynamic charge pump circuit 141, which may comprise the circuit as shown in FIG. 2, or 3.

Figure 5:
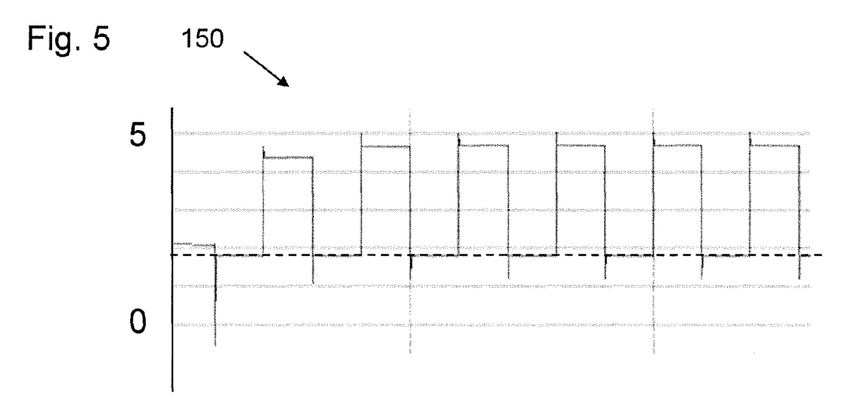
FIG. 5 shows a graph of the source voltage and gate voltage of a transistor of the second output invertor arrangement during operation.

FIG. 5 shows a graph 150 of the voltage (dashed line) at the gate terminal and the voltage at the source terminal (solid line) of the first transistor 100 of the first pair of transistors of the second output invertor. As the gate voltage is held constant at the circuit supply voltage while the source terminal voltage varies, the gate-source voltage across the transistor and remains below a threshold of approximately 3 volts, which may comprise a functional threshold of the transistor.

Figure 6:
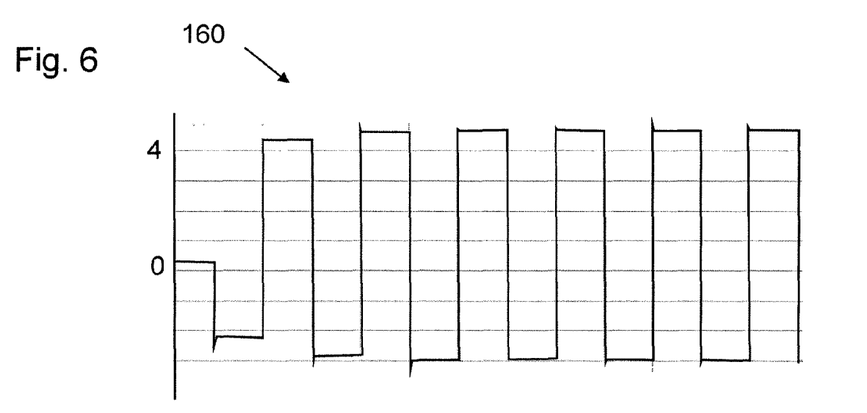
FIG. 6 shows a graph of the voltage at the second output during operation.

FIG. 6 shows a graph 160 of the voltage at the second output 65. The voltage swing is −3 volts to +4.5 volts (total 7.4 volts) (the voltages here are lower than the ideal value, because of parasitics, and the finite charge that is stored on the capacitors.)) while the second output invertor arrangement does not see such a voltage difference between any two of each of the transistor's terminals. The first circuit output 64 is similar but 180° out of phase.

Figure 7:
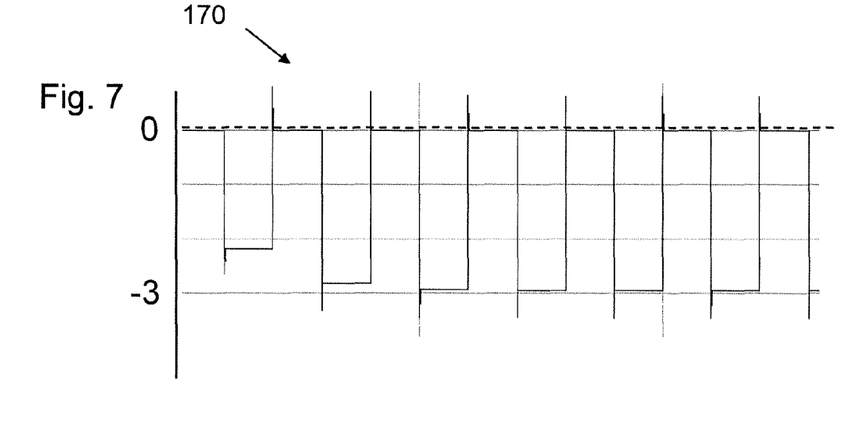
FIG. 7 shows a graph of the source voltage and gate voltage of a further transistor of the second output invertor arrangement during operation.

FIG. 7 shows a graph 170 of the gate terminal voltage (dashed line) and source terminal voltage (solid line) of the second transistor 101 of the first pair of transistors of the second output invertor. The gate voltage is constant at ground (0 volts) and the source voltage oscillates between 0 volts and −3 volts. Again the gate-source terminal voltage thus remains within a safety threshold as the gate terminal voltage is constant. It will be appreciated that a dynamic gate terminal voltage could lead to a gate-source voltage across one of the transistors at a particular time point being above a safety threshold. Thus, the constant gate voltage for the second output invertor is advantageous.

It will be appreciated that the voltages shows in the graphs in FIGS. 5-7 and described herein may be lower/different than those predicted ideally due to parasitic losses and the charge able to be stored in the capacitors of the charge pumps.

The capacitors 15, 18, 24, 27 of the first charge pump stage 2 may be of the same capacitance as the capacitors 74, 77, 82, 85 of the second charge pump stage. In other embodiments the capacitance of the capacitors of the second stage may be higher or lower than that of the first stage 2.

The invention claimed is:

1. A differential dynamic charge pump circuit comprising;
   a first charging stage in series with a second charging stage;
   the first charging stage comprising
      a first circuit input for receiving an alternating clock signal;
      a second circuit input for receiving an inverted version of the alternating clock signal;
      an upper charge pump arrangement between a voltage supply terminal for receiving a supply voltage for the circuit and the first and second input;
      a lower charge pump arrangement between a ground terminal of the circuit and the first and second input;
      a first output inverter arrangement configured to receive output voltages from the upper and lower charge pump arrangements and having a first output and a second output for providing a dynamic differential output;
   the second charging stage comprising
      a first input configured to receive an output signal from the first output of the first stage; and
      a second input configured to receive an output signal from the second output of the first stage;
      an upper charge pump arrangement between a voltage supply terminal for receiving a supply voltage for the circuit and the first and second input;
      a lower charge pump arrangement between a ground terminal of the circuit and the first and second input;
      a second output inverter arrangement configured to receive output voltages from the upper and lower charge pump arrangements and having a first output and a second output for providing a dynamic differential output of the circuit;
   wherein
      the first output inverter arrangement includes a first pair of transistors to control the voltage applied to the first output and a second pair of transistors configured to control the voltage applied to the second output, wherein gate terminals of the first pair of transistors and gate terminals of the second pair of transistors are configured to be dynamically controlled; and the second output inverter arrangement includes a first pair of transistors to control the voltage applied to the first output and a second pair of transistors configured to control the voltage applied to the second output, wherein a first transistor of the first pair of transistors and a first transistor of the second pair of transistors include a gate terminal and is configured to receive a first non-alternating voltage and a second transistor of the first pair of transistors and a second transistor of the second pair of transistors include a gate terminal configured to receive a second non-alternating voltage lower than the first non-alternating voltage.

2. A differential dynamic charge pump circuit according to claim 1, in which the gate terminals of the first pair of transistors of the first output arrangement are configured to receive the alternating signal from the first input; and the gate terminals of the second pair of transistors of the first output arrangement are configured to receive the alternating signal from the second input.

3. A differential dynamic charge pump circuit according to claim 1, in which the upper charge pump arrangement of the first charging stage and/or the second charging stage comprises;

a first switch having a first terminal connected to the voltage supply terminal and a second terminal connected to a first plate of a first capacitor, a second plate of the first capacitor connected to the first input to the particular stage;

a second switch having a first terminal connected to the voltage supply terminal and a second terminal connected to a first plate of a second capacitor, a second plate of the second capacitor connected to the second input of the particular stage; wherein the first and second switches are configured to be controlled such that a voltage above the supply voltage is generated and applied to the associated output inverter arrangement by virtue of a connection between the charge stored by at least one of the capacitors and the voltage supplied at the supply voltage terminal.

4. A differential dynamic charge pump circuit according to claim 1, in which the lower charge pump arrangement of the first charging stage and/or the second charging stage comprises;

a first switch having a first terminal connected to the ground terminal and a second terminal connected to a first plate of a first capacitor, a second plate of the first capacitor connected to the first input to the particular stage;

a second switch having a first terminal connected to the ground terminal and a second terminal connected to a first plate of a second capacitor, a second plate of the second capacitor connected to the second input of the particular stage; wherein the first and second switches are configured to be controlled such that a voltage below the ground voltage is generated and applied to the associated output inverter arrangement by virtue of a connection between the charge stored by at least one of the capacitors.

5. A differential dynamic charge pump circuit according to claim 3, in which first switch and/or second switch of one or both of the upper charge pump arrangements of the first stage and second stage comprises a transistor having a source terminal, a drain terminal and a gate terminal, the first terminal of the switch comprising the source terminal and the second terminal of the switch comprising the drain terminal.

6. A differential dynamic charge pump circuit according to claim 3, in which first switch and/or second switch of one or both of the lower charge pump arrangements of the first stage and second stage comprises a transistor having a source terminal, a drain terminal and a gate terminal, the first terminal of the switch comprising the source terminal and the second terminal of the switch comprising the drain terminal.

7. A differential dynamic charge pump circuit according to claim 3, in which first switch of a particular stage is adapted to be controlled by a signal derived from the second input to said particular stage.

8. A differential dynamic charge pump circuit according to claim 3, in which second switch of a particular stage is adapted to be controlled by a signal derived from the first input to said particular stage.

9. A differential dynamic charge pump circuit according to claim 1, in which, in the first output invertor arrangement, the first transistor of the first pair of transistors comprises a source terminal connected to a node on a connection between a second capacitor and a second switch of the upper charge pump arrangement;

the first transistor of the second pair of transistors comprises a source terminal connected to a node on a connection between a first capacitor and a first switch of the upper charge pump arrangement;

the second transistor of the first pair of transistors comprises a source terminal connected to a node on a connection between a second capacitor and a second switch of the lower charge pump arrangement;

the second transistor of the second pair of transistors comprises a source terminal connected to a node on a connection between a first capacitor and a first switch of the lower charge pump arrangement; and drain terminals of the first pair of transistors are connected together by a first drain connection, the first output of the first output invertor arrangement formed by a node on said first drain connection; and drain terminals of the second pair of transistors are connected together by a second drain connection, the second output of the first output invertor arrangement formed by a node on said second drain connection.

10. A differential dynamic charge pump circuit according to claim 1, in which, in the second output invertor arrangement, the first transistor of the first pair of transistors comprises a source terminal connected to a node on a connection between a second capacitor and a second switch of the upper charge pump arrangement;

the first transistor of the second pair of transistors comprises a source terminal connected to a node on a connection between a first capacitor and a first switch of the upper charge pump arrangement and connected to the source terminal of the first transistor of the first pair of transistors;

the second transistor of the first pair of transistors comprises a source terminal connected to a node on a connection between a second capacitor and a second switch of the lower charge pump arrangement;

the second transistor of the second pair of transistors comprises a source terminal connected to a node on a connection between a first capacitor and a first switch of the lower charge pump arrangement and connected to the source terminal of the first transistor of the first pair of transistors; and drain terminals of the first pair of transistors are connected together by a first drain connection, the first output of the second output invertor arrangement formed by a node on said first drain connection; and drain terminals of the second pair of transistors are connected together by a second drain connection, the second output of the second output invertor arrangement formed by a node on said second drain connection.

11. A differential dynamic charge pump circuit according to claim 1, in which the circuit includes a first DC output formed at an output of a rectifier, the rectifier configured to receive and rectify a signal from a node on a connection between a second capacitor and a second switch of the upper charge pump arrangement of the second charging stage and a node on a connection between a first capacitor and a first switch of the upper charge pump arrangement of the second charging stage.

12. A differential dynamic charge pump circuit according to claim 1, in which the circuit includes a second DC output formed at an output of a rectifier, the rectifier configured to receive and rectify a signal received from a node on a connection between a second capacitor and a second switch of the lower charge pump arrangement of the second charging stage and a node on a connection between a first capacitor and a first switch of the lower charge pump arrangement of the second charging stage.

13. A differential dynamic charge pump circuit according to claim 1, in which the circuit is configured to receive a single alternating clock signal and includes a signal inverter module configured to provide to the first input the un-modified clock signal and to the second input the clock signal phase shifted by 180°.

14. A sensor arrangement comprising a sensor element and a differential dynamic charge pump circuit according to claim 1 wherein said circuit is arranged to apply a voltage from one of the first and second output terminals to the sensor element.

15. A sensor arrangement as defined in claim 14 in which the sensor element comprises a MEMS microphone.

* * * * *